United States Patent
Kwon

(10) Patent No.: US 7,572,729 B2
(45) Date of Patent: Aug. 11, 2009

(54) METHOD OF MANUFACTURING SEMICONDUCTOR DEVICE

(75) Inventor: Il Young Kwon, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 104 days.

(21) Appl. No.: 11/635,909

(22) Filed: Dec. 8, 2006

(65) Prior Publication Data

US 2007/0238286 A1 Oct. 11, 2007

(30) Foreign Application Priority Data

Apr. 6, 2006 (KR) .................. 10-2006-0031497

(51) Int. Cl.
*H01L 21/4763* (2006.01)
(52) U.S. Cl. .............. 438/639; 438/702; 438/733; 257/E21.49; 257/E21.584
(58) Field of Classification Search .......... 438/639, 438/673, 702, 729, 731, 732, 733, 751; 257/E21.49, 257/E21.584
See application file for complete search history.

(56) References Cited

U.S. PATENT DOCUMENTS

| | | | | |
|---|---|---|---|---|
| 5,527,736 A | * | 6/1996 | Huang et al. | 438/648 |
| 6,153,492 A | * | 11/2000 | Wege et al. | 438/401 |
| 6,475,916 B1 | * | 11/2002 | Lee et al. | 438/706 |
| 6,707,154 B2 | * | 3/2004 | Terauchi et al. | 257/754 |
| 7,074,717 B2 | * | 7/2006 | Rhodes | 438/639 |
| 2002/0090784 A1 | * | 7/2002 | Yoon | 438/257 |
| 2005/0009321 A1 | * | 1/2005 | Ryu | 438/624 |
| 2006/0046318 A1 | * | 3/2006 | Ueda et al. | 438/3 |
| 2006/0151887 A1 | * | 7/2006 | Oh et al. | 257/774 |
| 2009/0102007 A1 | * | 4/2009 | Kocon | 257/471 |

FOREIGN PATENT DOCUMENTS

| | | |
|---|---|---|
| KR | 10-2003-0055401 | 7/2003 |
| KR | 1020040070496 | 8/2004 |
| KR | 2005-11461 | 1/2005 |
| KR | 10-2005-0064328 | 6/2005 |
| KR | 10-2006-0008596 | 1/2006 |

* cited by examiner

*Primary Examiner*—Caridad M Everhart
(74) *Attorney, Agent, or Firm*—Marshall, Gerstein & Borun LLP

(57) ABSTRACT

A method of manufacturing semiconductor devices, including the steps of forming an insulating layer on a semiconductor substrate in which predetermined structures are formed, and etching the insulating layer to expose a predetermined region of the semiconductor substrate, thereby forming a contact hole, forming an insulating layer on the sides of the contact hole, and forming a conductive layer within the contact hole, forming a contact plug. It is possible to prevent a short problem by sufficiently securing a distance between a drain contact plug and a virtual power line.

12 Claims, 3 Drawing Sheets

METHOD OF MANUFACTURING SEMICONDUCTOR DEVICE

BACKGROUND OF THE INVENTION

The invention relates in general to a method of manufacturing semiconductor devices and, more particularly, to a method of manufacturing a semiconductor device, wherein short problems can be prevented by sufficiently securing a distance between a drain contact plug and a virtual power (VIRPWR) line.

In general, the erase operation of a flash memory device is performed by discharging the electrons of a floating gate from a semiconductor substrate by means of Fowler-Nordheim (F-N) tunneling. The erase operation is performed by applying a high voltage (about 20 V) to the semiconductor substrate. The flash memory device includes a page buffer for reading data stored in a memory cell array. The page buffer is connected to the bit line of the memory cell array through a bit line selection unit.

FIG. 1 is a circuit diagram showing the constriction of a bit line selection unit.

Referring to FIG. 1, an even bit line select transistor HV1 and an odd bit line select transistor HV2 are serially connected between an even bit line BLe and an odd bit line BLo in order to select either of the even bit line BLe and the odd bit line BLo according to even and odd bit line bias signals DISCHe and DISCHo. Virtual power (VIRPWR) is applied to the bit line through the transistors HV1 and HV2. Furthermore, the bit line selection unit includes a connection transistor HV3 for connecting a connection node SO and the even bit line BLe and a connection transistor HV4 for connecting the node SO and the odd bit line BLo. The connection transistor HV3 and the connection transistor HV4 are driven according to the even and odd bit line select signals BSLe and BSLo, respectively. Each of the bit line select transistors HV1 and HV2 and the connection transistors HV3 and HV4 includes a high voltage NMOS transistor. The connection node SO is a connection node of a bit line selection unit and a page buffer.

The bit line selection unit constructed as described above is connected to the junction of the even bit line BLe and the select transistor HV1 at a node Q1. The select transistor HV1 is driven in response to the even bit line bias signal DISCHe, so that a ground voltage Vss or a power supply voltage Vcc applied through the virtual power (VIRPWR) line is applied to the bit line. The bit line selection unit is also connected to the junction of the odd bit line BLo and the select transistor HV2 at a node Q2. The select transistor HV2 is driven in response to the odd bit line bias signal DISCHo, so that the ground voltage Vss or the power supply voltage Vcc supplied through the virtual power (VIRPWR) line is applied to the bit line.

FIG. 2 is a cross-sectional view of a contact plug for connecting the junction of a bit line of a bit line selection unit and a bit line select transistor, and a virtual power (VIRPWR) line.

Referring to FIG. 2, an insulating layer 22 is formed on a semiconductor substrate 21 in which predetermined structures are formed. A contact plug 23, which is connected to the junction (not shown) of a bit line select transistor, is formed at a predetermined region of the insulating layer 22. Furthermore, a bit line 24 and the contact plug 23 are interconnected, and the contact plug 23 and a virtual power (VIRPWR) line 25 are spaced apart from each other at a predetermined distance. In addition, between-the bit line 24 and the virtual power line 25 keeps insulated by means of an insulating layer 26.

In the bit line selection unit having the above-mentioned cross section, however, a distance between the contact plug 23 and the virtual power line 25 that is varied according to the cell operation cannot be secured sufficiently. Accordingly, at the time of a cycling test, a leakage path is formed, resulting in failure in the erase operation. This degrades the reliability of the device.

SUMMARY OF THE INVENTION

Accordingly, the invention addresses the problems described above and discloses a method of manufacturing a semiconductor device, wherein a short problem can be prevented in such a manner that a distance between a drain contact plug and a virtual power line can be secured sufficiently by forming an insulating layer on the sides of a drain contact hole.

According to one aspect, the invention provides a method of manufacturing a semiconductor device including the steps of forming an insulating layer over a semiconductor substrate, etching the insulating layer to expose the semiconductor substrate to form a contact hole having sides, forming an insulating layer on the sides of the contact hole, forming a conductive layer within the contact hole to form a contact plug, recessing a portion of a top surface of the insulating layer, and etching a portion of upper portions of the conductive layer.

DESCRIPTION OF SPECIFIC EMBODIMENTS

Various embodiments of the invention will be described with reference to the accompanying drawings. Because various embodiments are provided for the purpose that the ordinary persons skilled in the art are able to understand the inventions, they may be modified in various manners and the scope of the invention is not limited by the various embodiments described later.

FIGS. 3A to 3D are cross-sectional views illustrating a method of manufacturing a semiconductor device according to an embodiment of the invention. FIG. 3 shows a method of forming a bit line selection unit for connecting a bit line and a page buffer and a drain contact plug of a high voltage transistor in a NAND flash memory device.

Figure 1:
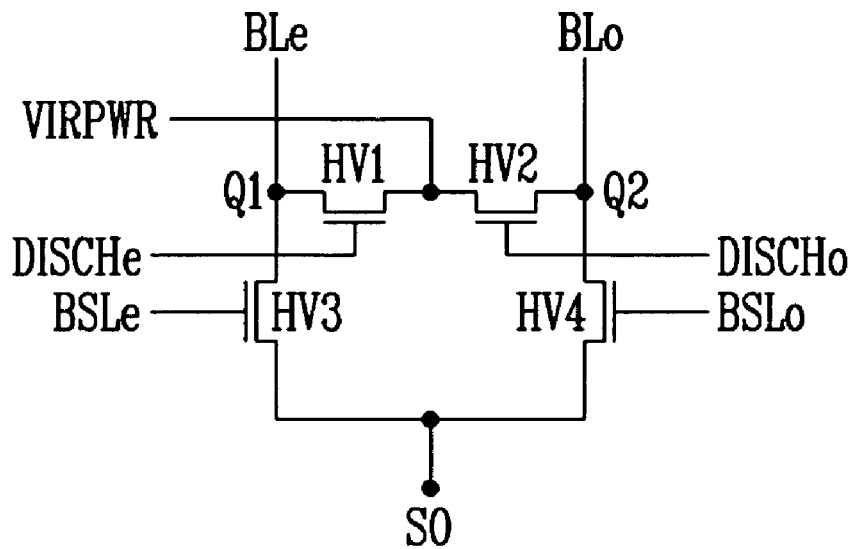
FIG. 1 is a circuit diagram showing the constriction of a prior art bit line selection unit.
Figure 2:
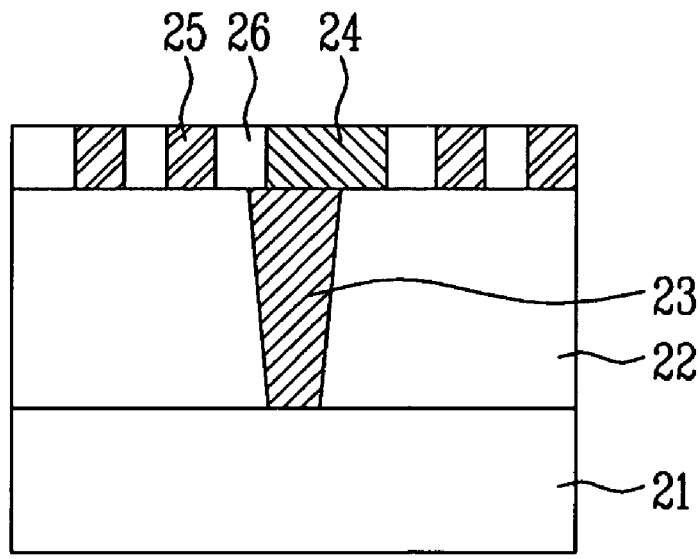
FIG. 2 is a cross-sectional view of a prior art contact plug for connecting the junction of a bit line of a bit line selection unit and a bit line select transistor, and a virtual power (VIRPWR) line.
Figure 3A:
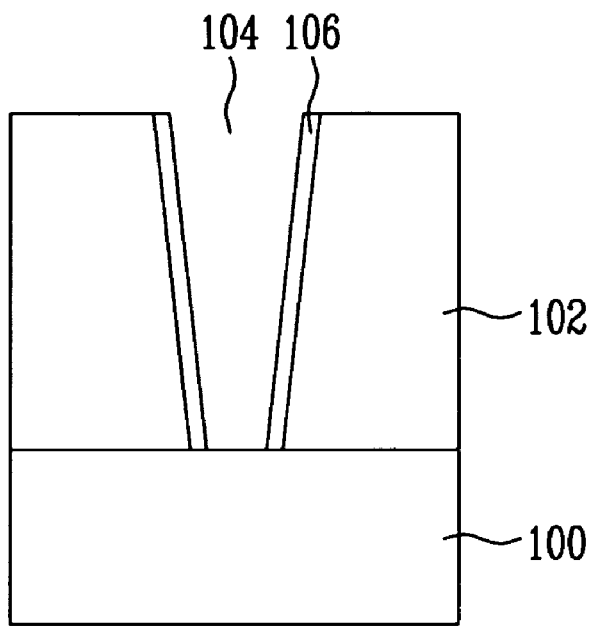
FIGS. 3A to 3D are cross-sectional views illustrating a method of manufacturing a semiconductor device according to an embodiment of the invention.

Referring to FIG. 3A, an insulating layer 102 is formed on a semiconductor substrate 100 in which predetermined structures including a high voltage transistor are formed. The insulating layer 102 is etched such that a predetermined region of the semiconductor substrate 100, for example, the drain of the high voltage transistor is exposed, thereby forming a drain contact hole 104.

An insulating layer 106 is formed within the drain contact hole 104. An etch-back process is then performed so that the insulating layer 106 remains only on the sides of the drain contact hole 104. The insulating layer 106 may preferably be formed to a thickness of 30 Å to 100 Å and may be formed using a nitride layer, preferably, $Si_3N_4$, by a chemical vapor deposition (CVD) or atomic layer deposition (ALD) method, which can secure the wet etch selectivity with an oxide layer.

Figure 3B:
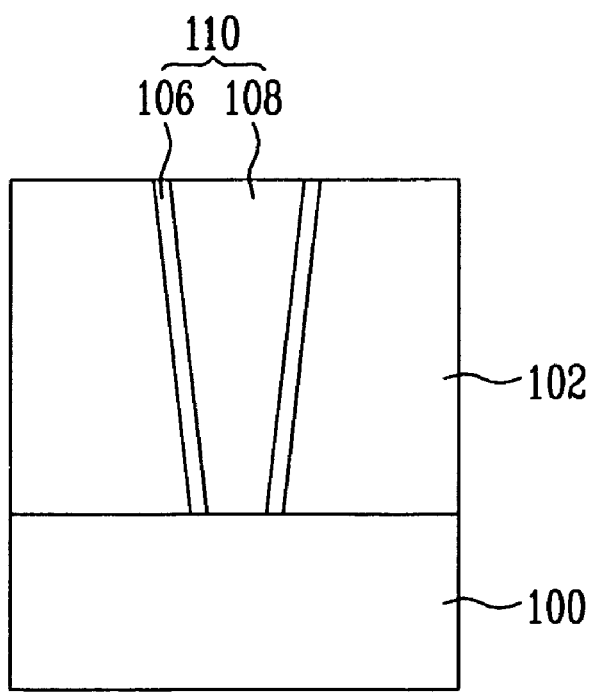

Referring to FIG. 3B, a conductive layer 108 is formed on the entire surface in such a way to bury the drain contact hole 104. The conductive layer 108 may preferably be formed of polysilicon. The conductive layer 108 is polished until a top surface of the insulating layer 102 is exposed, forming a drain contact plug 110 including the insulating layer 106 and the conductive layer 108.

Figure 3C:
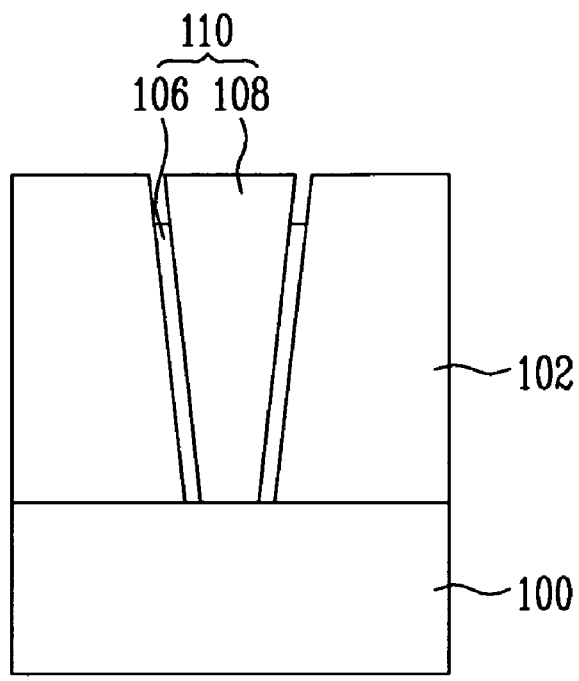

Referring to FIG. 3C, a wet etch process is performed to partially recess a top surface of the insulating layer 106. In the wet etch process, a $H_3PO_4$ solution is preferably used and the insulating layer 106 is removed preferably to a thickness of about 50 Å to 100 Å.

Figure 3D:
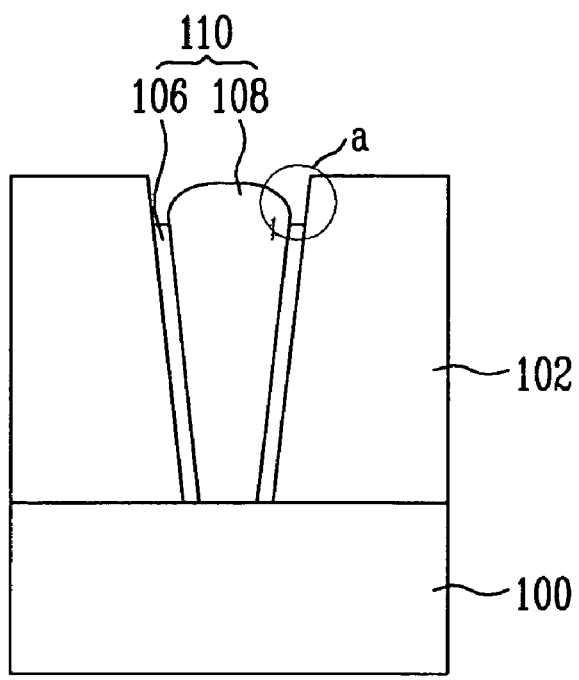

Referring to FIG. 3D, a dry etch process is then performed to make rounded (a) top corners of the conductive layer 108. The dry etch process may preferably be carried out using a microwave equipment in which it allows for an isotropic etch process and a bias is not applied to the cathode electrode or an equipment in which a inductively coupled plasma (ICP) type source is mounted, for example.

Furthermore, at the time of the dry etch process, a mixed gas of $SF_6$ and $Cl_2$, which facilitates isotropic etch, is preferably used. If it is necessary to control the etch selectivity with the insulating layer, an oxygen ($O_2$) gas may added to the mixed gas of $SF_6$ and $Cl_2$. In this case, an amount of the $O_2$ gas in the mixed gas of $SF_6$ and $Cl_2$ is preferably about 5% to 10% of the total amount of the mixed gas of $SF_6$ and $Cl_2$. Alternatively, an etch process using hot SC-1 solution may be performed instead of the dry etch process. In this case, the conductive layer 108 is etched to a thickness of about 100 Å to 300 Å through the etch process.

As described above, a portion of the top surface of the insulating layer 106 is removed by the wet etch process. Therefore, the top corners of the conductive layer 108 can be made more rounded at the time of the dry etch process.

As described above, the invention has the following advantages.

Since the top corners of the conductive layer are made rounded, the concentration of an electric field can be prevented.

Furthermore, the insulating layer is formed on the sides of the drain contact hole. Accordingly, a short problem can be prevented since a distance between the drain contact plug and the virtual power line is sufficiently secured.

While the invention has been described in connection with practical exemplary embodiments, the invention is not limited to the disclosed embodiments but, to the contrary, is intended to cover various modifications and equivalent arrangements included within the spirit and scope of the appended claims.

What is claimed is:

1. A method of manufacturing a semiconductor device, comprising:
    forming a first insulating layer over a semiconductor substrate;
    etching the first insulating layer to expose the semiconductor substrate to form a contact hole having sides;
    forming a second insulating layer on the sides of the contact hole;
    forming a conductive layer within the contact hole to form a contact plug;
    recessing a portion of a top surface of the second insulating layer to expose an upper portion of the conductive layer; and
    etching said upper portion of the conductive layer.

2. The method of claim 1, comprising forming the second insulating layer using a nitride layer by a chemical vapor deposition (CVD) or atomic layer deposition (ALD) method.

3. The method of claim 1, comprising forming the second insulating layer to a thickness of 30 Å to 100 Å.

4. The method of claim 1, comprising etching the portion of the conductive layer using a hot SC-1 solution.

5. The method of claim 1, comprising rounding top corners of the conductive layer by the etch process.

6. The method of claim 1, comprising etching the conductive layer to a thickness of 100 Å to 300 Å by the etch process.

7. The method of claim 1, comprising recessing the portion of a top surface of the second insulating layer employing a wet etch process.

8. The method of claim 7, comprising:
    employing a $H_3PO_4$ solution in the wet etch process, and removing the second insulating layer to a thickness of about 50 Å to 100 Å.

9. The method of claim 1, comprising etching the portion of the conductive layer employing a dry etch process using microwave equipment or equipment in which a inductively coupled plasma (ICP) source is mounted.

10. The method of claim 9, comprising performing the dry etch process using a mixed gas of $SF_6$ and $Cl_2$.

11. The method of claim 10, wherein the mixed gas further comprises oxygen ($O_2$) gas.

12. The method of claim 11, wherein the $O_2$ gas present in the mixed gas of $SF_6$ and $Cl_2$ comprises about 5% to 10% of the total amount of the mixed gas.

* * * * *